United States Patent
Toyoshima et al.

(10) Patent No.: US 8,067,789 B2
(45) Date of Patent: Nov. 29, 2011

(54) SEMICONDUCTOR INTEGRATED CIRCUIT DEVICE

(75) Inventors: Shunsuke Toyoshima, Tokyo (JP); Kazuo Tanaka, Tokyo (JP); Masaru Iwabuchi, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/959,635

(22) Filed: Dec. 3, 2010

(65) Prior Publication Data

US 2011/0073914 A1  Mar. 31, 2011

Related U.S. Application Data

(60) Continuation of application No. 12/635,675, filed on Dec. 10, 2009, now Pat. No. 7,863,652, which is a division of application No. 11/963,808, filed on Dec. 22, 2007, now abandoned.

(30) Foreign Application Priority Data

Jan. 15, 2007 (JP) ................................. 2007-005517

(51) Int. Cl.
  *H01L 23/52* (2006.01)
(52) U.S. Cl. ................. 257/203; 257/207; 257/E23.141
(58) Field of Classification Search .................. 257/203
  See application file for complete search history.

(56) References Cited

U.S. PATENT DOCUMENTS

| | | | |
|---|---|---|---|
| 5,892,276 A | 4/1999 | Miki et al. |
| 6,507,469 B2 | 1/2003 | Andoh |
| 6,858,885 B2 | 2/2005 | Ebara |
| 6,992,356 B2 | 1/2006 | Taniguchi et al. |
| 2001/0053054 A1 | 12/2001 | Andoh |
| 2004/0056355 A1 | 3/2004 | Minami et al. |
| 2004/0106228 A1 | 6/2004 | Wu |
| 2005/0087807 A1 | 4/2005 | Righter |
| 2007/0120258 A1 | 5/2007 | Hayashi et al. |

FOREIGN PATENT DOCUMENTS

| | | |
|---|---|---|
| JP | 9-283632 A | 10/1997 |
| JP | 2003-163267 A | 6/2003 |

*Primary Examiner* — Jarrett Stark
*Assistant Examiner* — Lawrence Tynes, Jr.
(74) *Attorney, Agent, or Firm* — Miles & Stockbridge P.C.

(57) ABSTRACT

To provide a semiconductor integrated circuit device advantageous against EM and ESD. A plurality of I/O cells; a power wire formed of a plurality of interconnect layers over the above-described I/O cells; a bonding pad formed in an upper layer of the power wire and in a position corresponding to the I/O cell; and lead-out areas capable of electrically coupling the I/O cell to the bonding pad are provided. The above-described power wire includes a first power wire and a second power wire, and the above-described I/O cell includes first elements coupled to the first power wire and second elements coupled to the second power wire. The first element is placed on the first power wire side, and the second element is placed on the second power wire side. The first power wire and the second power wire can allow for a high current due to the interconnect layers over the I/O cells, thus having robustness against EM and ESD.

4 Claims, 13 Drawing Sheets

US 8,067,789 B2

SEMICONDUCTOR INTEGRATED CIRCUIT DEVICE

CROSS-REFERENCE TO RELATED APPLICATIONS

This application is a continuation of application Ser. No. 12/635,675 filed Dec. 10, 2009 now U.S. Pat. No. 7,863,652, which is a division of application Ser. No. 11/963,808 filed Dec. 22, 2007 now abandoned. The disclosure of Japanese Patent Application No. 2007-5517 filed on Jan. 15, 2007 including the specification, drawings and abstract is also incorporated herein by reference in its entirety.

BACKGROUND OF THE INVENTION

The present invention relates to a semiconductor integrated circuit device, and more particularly to a technique which is useful for layout of a structure for placing a pad over an I/O cell in the same.

A chip-like semiconductor integrated circuit device is manufactured, for example, by forming various semiconductor integrated circuit devices in a semiconductor wafer composed of a single crystal silicon and the like, and thereafter separating the semiconductor wafer into individual semiconductor chips by dicing. In the principal surface of a semiconductor integrated circuit device, a plurality of bonding pads as external terminals is provided along the peripheral portion of the semiconductor integrated circuit device.

For example, Japanese patent laid-open No. 9-283632 describes a technique concerning a semiconductor integrated circuit device, in which a plurality of rows of bonding pads is arranged in a staggered manner along the outer peripheral portion of a semiconductor chip, the semiconductor integrated circuit device having three or more interconnect layers, wherein a first lead-out wire is formed of one or more layers of wires including at least a top layer wire, the first lead-out wire electrically coupling an inner row of bonding pads to an internal circuit, and wherein a second lead-out wire is formed of a plurality of layers of wires, the layers being different from that of the first lead-out wire, the second lead-out wire electrically coupling an outer row of bonding pads to the internal circuit.

Moreover, Japanese patent laid-open No. 2003-163267 describes a technique concerning a semiconductor integrated circuit device including a cell part and a buffer circuit part formed so as to surround the cell part, wherein a plurality of bonding pads is formed over the outer peripheral portion of the buffer circuit part as well as over the buffer circuit part, respectively, and is arranged in a staggered manner over the outer peripheral portion of the buffer circuit part as well as over the buffer circuit part.

SUMMARY OF THE INVENTION

With the more advanced device-process technology generations, the supply voltage, gate film thickness, and gate width will decrease in the internal logic part, so that the area thereof is getting smaller according to the scaling rule. On the other hand, there is no change in the supply voltage or the like in the I/O (input/output) part, so that at present the area thereof is reduced by devising a circuit design.

In order to reduce the area of the I/O cell, the number of examples using a PAA (PAD on Active Area) technique, in which a pad conventionally placed outside the I/O is placed over the I/O cell, is increasing. However, if this PAA technique is employed, then the top layer of metal wires is assigned for a bonding pad and a metal layer directly under this bonding pad is assigned for a buffer layer for bonding, and therefore the number of metal layers available for peripheral wires decreases by this amount, and thus the restrictions for avoiding electromigration (EM) and a destruction due to electrostatic discharge (ESD) become severe.

In SoC (System On a Chip) products using the PAA technique, the function given to the I/O cell is simple, and therefore, assuming a staggered arrangement, the component arrangement could be devised as to have robustness against electro-migration and electrostatic discharge by using the fact that the width of the I/O cell is equal to or less than half the pad width.

On the other hand, in microcomputer I/O cells, the area thereof tends to increase as compared with the I/O cell in SoC for various reasons, such as that the function thereof is complicated and that an MOS transistor with a sufficiently thicker gate film thickness is used in consideration of an application of voltage of 5V or more, and thus the staggered arrangement is sometimes difficult to implement.

It is an object of the present invention to provide semiconductor integrated circuit devices including an I/O cell with a cell width almost equal to the width of a pad and having robustness against electro-migration and electrostatic discharge.

The above and other objects and novel features of the present invention will be apparent from the description and the accompanying drawings of this specification.

The typical invention among the inventions disclosed in the present application will be described briefly as follows.

Namely, a plurality of I/O cells formed in a semiconductor substrate; a power wire for supplying an operation power to the I/O cell, the power wire being formed of a plurality of interconnect layers over the I/O cells; a bonding pad formed in an upper layer of the power wire and in a position corresponding to the I/O cell; and a lead-out area capable of electrically coupling the I/O cell to the bonding pad are provided. Here, the power wire includes a first power wire and a second power wire. The I/O cell includes a first element coupled to the first power wire and a second element coupled to the second power wire. The first element is placed on the first power wire side and the second element is placed on the second power wire side. According to the above-described configuration, the first power wire and the second power wire can allow for a high current due to the interconnect layers over the I/O cell, thus having robustness against EM and ESD.

The effect obtained by a typical invention among the inventions disclosed in the present application will be described briefly as follows.

Namely, it is possible to provide a semiconductor integrated circuit device including an I/O cell with a cell width almost equal to the width of a pad and having robustness against electro-migration and electrostatic discharge.

DETAILED DESCRIPTION OF THE PREFERRED EMBODIMENTS

1. Typical Embodiment

Figure 1:
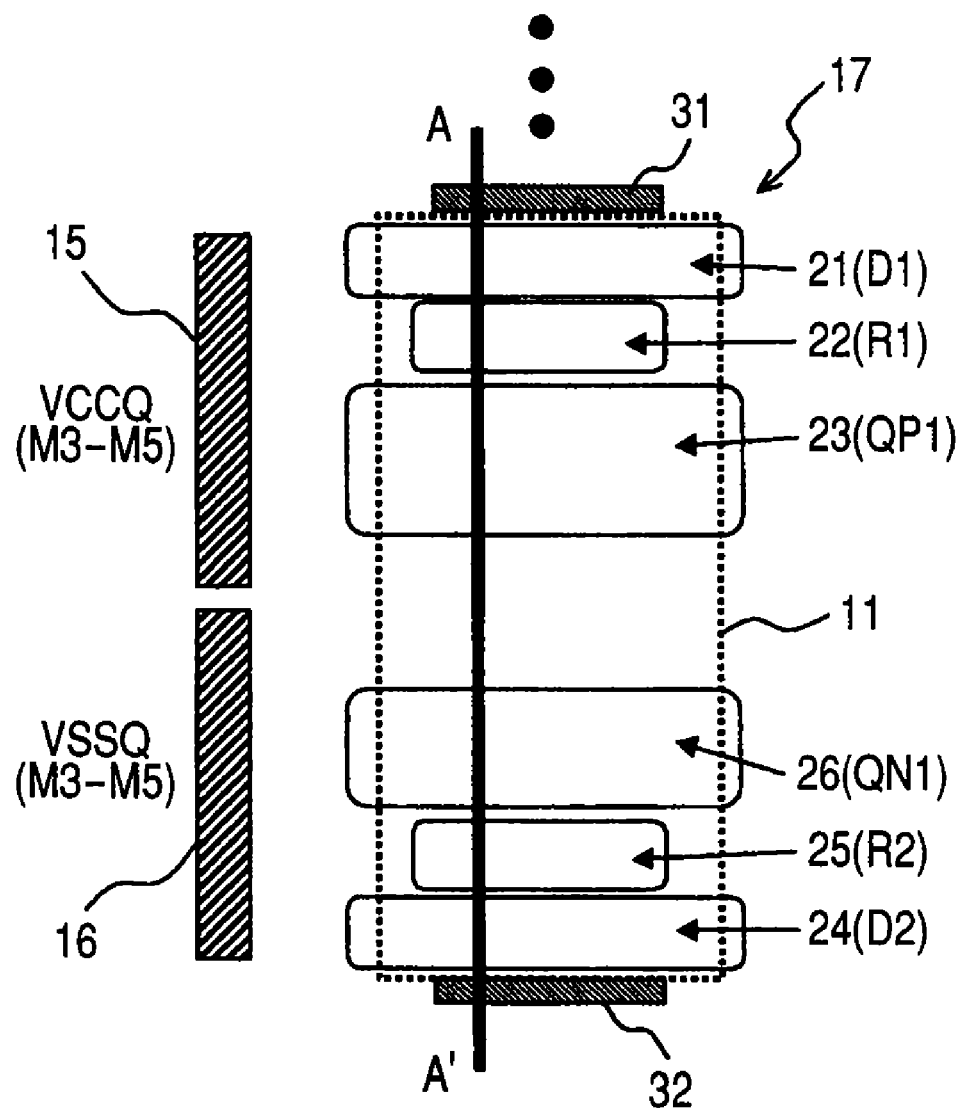
FIG. 1 is a plan view of the principal part in a semiconductor integrated circuit device concerning the present invention.

First, an overview concerning a typical embodiment of the invention disclosed in the present application will be described. Reference numerals of the accompanying drawings that are referred to with a parenthesis in the general description concerning the typical embodiment just exemplify the one contained in the concept of a constituent element with the parenthesized reference numeral.

[1] According to an aspect of a semiconductor integrated circuit device concerning a typical embodiment of the present invention, a semiconductor integrated circuit device (10) includes: a semiconductor substrate (40); a plurality of I/O cells (17) formed in the semiconductor substrate; power wires (15, 16) for supplying an operation power to the I/O cells, the power wires being formed of a plurality of interconnect layers over the I/O cells; a bonding pad (11) formed in an upper layer of the power wire and in a position corresponding to the I/O cell; and lead-out areas (31, 32) for electrically coupling the I/O cell to the bonding pad. Here, the power wire includes a first power wire (15) to be set to a high-potential-side supply voltage level and a second power wire (16) to be set to a ground level, and the I/O cell includes first elements (D1, QP1) coupled to the first power wire, and second elements (D2, QN1) coupled to the second power wire. Then, the first elements are placed on the first power wire side and the second elements are placed on the second power wire side. According to this, the first power wire can be shared by the first elements and the second power wire can be shared by the second elements. The first power wire and the second power wire are formed of a plurality of interconnect layers over the I/O cells, thus allowing for a high current and having robustness against EM and ESD.

[2] The lead-out area may include: a first lead-out area (31) for electrically coupling the I/O cell from the first power wire side to the bonding pad; and a second lead-out area (32) for electrically coupling the I/O cell from the second power wire side to the bonding pad.

[3] The semiconductor integrated circuit device (10) may further include a plurality of interconnect layers (M3 to M5) between the I/O cell and the bonding pad, wherein the first power wire and the second power wire may be formed of the interconnect layers excluding a interconnect layer directly under the bonding pad. The interconnect layer directly under the bonding pad serves as a buffer for bonding.

[4] The first element may include a p-channel type MOS transistor (QP1) for outputting data and a first diode element (D1) for protecting the p-channel type MOS transistor, and the second element may include an n-channel type MOS transistor (QN1) for outputting data and a second diode element (D2) for protecting the n-channel type MOS transistor.

[5] The I/O cell may include: a first protective resistance element (R1) coupled between the p-channel type MOS transistor and the first diode elements; and a second protective resistance element (R2) coupled between the n-channel type MOS transistor and the second diode element.

[6] The I/O cell may include a p-channel type MOS transistor (BUF1) and n-channel type MOS transistor (BUF2) constituting pre-buffers for driving the p-channel type MOS transistor and n-channel type MOS transistor based on data to be output.

[7] The semiconductor integrated circuit device may include: a power cell (90) for taking in a power supply; a power-supply bonding pad (93) formed over the power cell; and power-supply lead-out areas (91, 92) for electrically coupling the power cell to the power-supply bonding pad.

[8] The power cell may include protective elements (D3, QN2) for protecting a circuit from a surge, wherein the one coupled to the power wire among the protective elements may be placed in the vicinity of the power wire.

2. Description of Preferred Embodiments

Next, preferred embodiments will be described more in detail. In all the drawings that illustrate the preferred embodiments, elements with like functions are designated by like reference numerals and repeated descriptions of such elements are omitted. In addition, in the accompanying drawings used in the embodiments, hatching may be omitted for viewability even in a cross sectional view. Moreover, hatching may be used for viewability even in a plan view or a perspective view.

Figure 15:
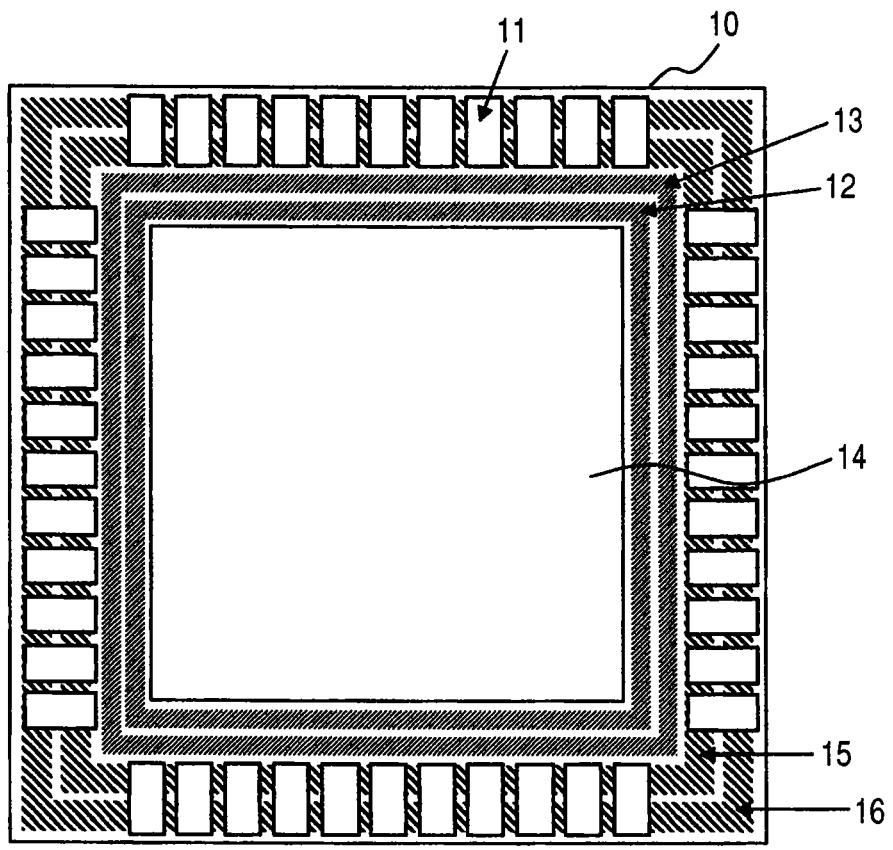
FIG. 15 is a plan view of the semiconductor integrated circuit device concerning the present invention.

FIG. 15 shows an example of chip layout of a semiconductor integrated circuit device concerning the present invention.

A semiconductor integrated circuit device 10 shown in FIG. 15 is formed, for example, by forming various semiconductor integrated circuit devices and bonding pads in a semiconductor substrate (semiconductor wafer) composed of a single crystal silicon and the like and thereafter separating the semiconductor substrate into individual chips by dicing or the like. Accordingly, the semiconductor integrated circuit device 10 is a semiconductor chip.

A core area 14 is placed in the center portion of the principal surface of the semiconductor integrated circuit device 10. Various internal circuits are formed in the core area 14. The core area 14 is configured, for example, by arranging many basic cells in a matrix, the basic cells being configured by combining a predetermined number of n-channel type MOS transistors and p-channel type MOS transistors, and a desired logic function is achieved by connecting between the MOS transistors in each basic cell and between the basic cells based on a logic design.

In the principal surface of the semiconductor integrated circuit device 10, a plurality of bonding pads (also simply referred to as a "pad") 11 is arranged along the outer peripheral portion. Each bonding pad 11 serves as an external terminal allowing for electrical coupling to an external device.

Figure 11:
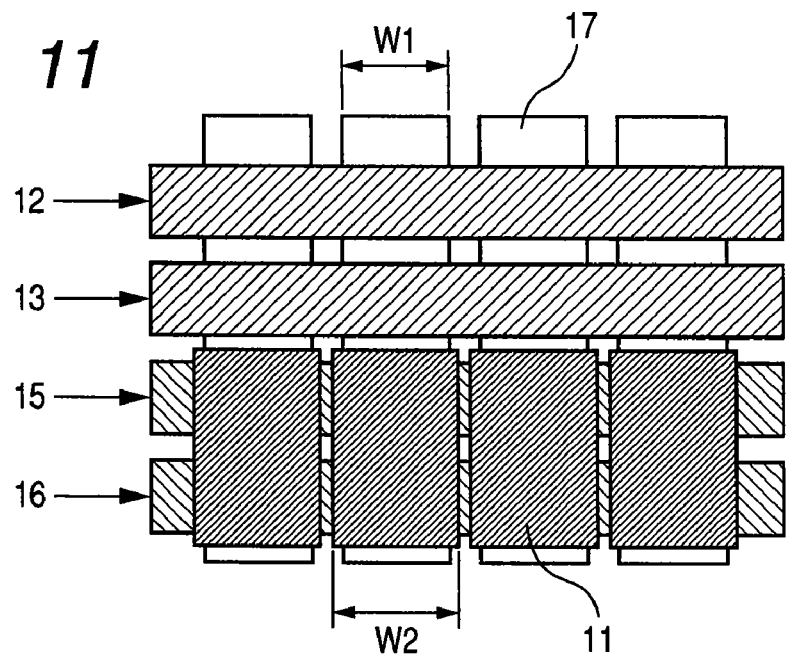
FIG. 11 is a plan view of the principal part in the semiconductor integrated circuit device concerning the present invention.

Moreover, a core power wire 12 and a core ground wire (earth wire) 13 used for the core area 14 are arranged outside the core area 14 of the principal surface of the semiconductor integrated circuit device 10, and further outside thereof an I/O power wire 15 and an I/O ground wire 16 used for the input/output (I/O) are arranged. All the core power wire 12, core ground wire 13, I/O power wire 15, and I/O ground wire 16 extend along the outer peripheral portion of the principal surface of the semiconductor integrated circuit device 10. Moreover, as shown in FIG. 11, a plurality of I/O cells 17 is formed under the core power wire 12, the core ground wire 13, the I/O power wire 15, and the I/O ground wire 16. Then, a plurality of pads (PAD) 11 corresponding to the I/O cell 17 is provided over the I/O power wire 15 and I/O ground wire 16 using the PAA technique. Although not limited in particular, a width W1 of the I/O cell 17 and a width W2 of the pad 11 corresponding thereto are made almost equal.

Figure 12:
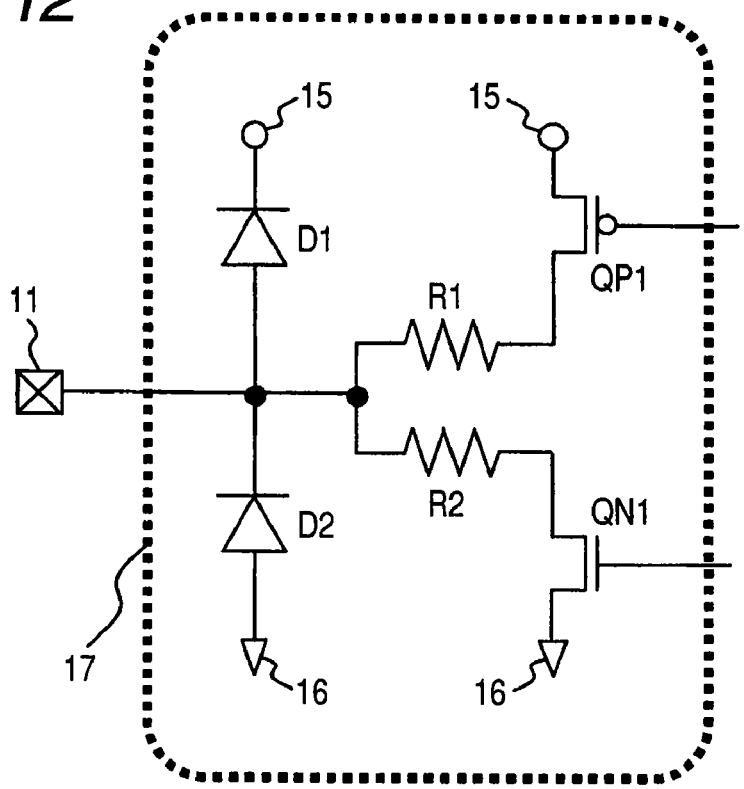
FIG. 12 is a circuit diagram of a configuration example of an I/O cell in the semiconductor integrated circuit device concerning the present invention.

FIG. 12 shows a configuration example of the I/O cell 17.

The p-channel type MOS transistor QP1 and n-channel type MOS transistor QN1 allowing for the output of data (output control or input/output control) are provided in the I/O cell 17. The p-channel type MOS transistor QP1 and n-channel type MOS transistor QN1 are drive-controlled by a signal transmitted from the core area 14. A drain electrode of the p-channel type MOS transistor QP1 is coupled to the I/O power wire 15, and a source electrode of the n-channel type MOS transistor QN1 is coupled to the I/O ground wire 16. The source electrode of the p-channel type MOS transistor QP1 is coupled to the pad 11 via a protective resistance element R1. The drain electrode of the n-channel type MOS transistor QN1 is coupled to the pad 11 via a protective resistance element R2. A protective diode element D1 is provided between the pad 11 and the I/O power wire 15, and a protective diode element D2 is provided between the pad 11 and the I/O ground wire 16. For example, if a surge (ESD surge) or the like is input to the bonding pad 11, the resistance elements R1 and R2 prevent the surge input to the p-channel type MOS transistor QP1 and n-channel type MOS transistor QN1, and bypass the surge to the I/O power wire 15 or the I/O ground wire 16 via the diode element D1 or the diode element D2. This allows the p-channel type MOS transistor QP1 and n-channel type MOS transistor QN1 to be protected from a surge. The diode elements D1, D2 and the resistance elements R1, R2 are formed in the semiconductor substrate.

FIG. 1 shows a layout example of the main part in FIG. 11. Moreover, FIG. 2 magnifies and shows the cross section cut along A-A' line in FIG. 1.

For example, in the principal surface of a semiconductor substrate (semiconductor wafer) 40 composed of a p-type single crystal silicon and the like, there are provided a diode element D1 forming region 21, a resistance element R1 forming region 22, a p-channel type MOS transistor QP1 forming region 23, a diode element D2 forming region 24, a resistance element R2 forming region 25, and an n-channel type MOS transistor QN1 forming region 26. These regions are electrically isolated from one another by an isolation region 43 formed in the principal surface of the semiconductor substrate 40. The isolation region 43 is composed of an insulator (field insulating film or embedded insulating film), such as silicon oxide, and can be formed, for example, by an STI (Shallow Trench Isolation) method, a LOCOS (Local Oxidization of Silicon) method, or the like.

Moreover, a p-well (p-type semiconductor region) 41 and an n-well (n-type semiconductor region) 42 are formed in the principal surface of the semiconductor substrate 40. The p-well 41 is formed in a region, which contains the diode element D2 forming region 24, the resistance element R2 forming region 25, and the n-channel type MOS transistor QN1 forming region 26 in a planar manner. The n-well 42 is formed in a region, which contains the diode element D1 forming region 21, the resistance element R1 forming region 22, and the p-channel type MOS transistor QP1 forming region 23 in a planar manner.

In the n-channel type MOS transistor QN1 forming region 26, a gate electrode 51 is formed over the p-well 41 via a gate insulating film (not shown). An n-type semiconductor region (n type diffusion layer) as a source/drain is formed in the regions at both sides of this gate electrode 51. The n-channel type MOS transistor QN1 is formed of the gate electrode 51, the gate insulating film under this gate electrode, and the n-type semiconductor region as the source/drain.

The configuration of the p-channel type MOS transistor QP1 forming region 23 is almost the same as the one with the reversed conductivity types of the n-channel type MOS transistor QN1 forming region 26. That is, in the p-channel type MOS transistor QP1 forming region 23, a gate electrode 52 is formed over the n-well 42 via a gate insulating film, and a p-type semiconductor region (p-type diffusion layer) as the source/drain is formed in the regions at both sides of the gate electrodes 52. This gate electrode 52 is made of a polycrystalline silicon (doped polysilicon) film of low resistance, for example, and these gate electrodes 52 are electrically coupled to each other by non-illustrated wires and the like. The p-channel type MOS transistor QP1 is formed of the gate electrode 52, the gate insulating film (not shown) under this gate electrode, and the p-type semiconductor region as the source/drain.

In the resistance element forming region 25, an isolation region 43 is entirely formed, and over this isolation region the resistance element R2 made of, for example, a polycrystalline silicon (doped polysilicon) film 54 with introduced impurities is formed.

The configuration of the resistance element forming region 22 is almost the same as that of the resistance element forming region 25. Namely, in the resistance element forming region 22, the isolation region 43 is entirely formed, and over this isolation region 43 the resistance element R1 made of, for example, a polycrystalline silicon (doped polysilicon) film 53 with introduced impurities is formed.

The resistance values of the resistance elements R1, R2 are adjustable to a desired value by adjusting the concentration of impurities introduced into the polycrystalline silicon film that constitutes the resistance element, the dimensions of the polycrystalline silicon film that constitutes the resistance element, or the distance between contact portions to be coupled to the resistance element.

In the diode element forming region 24, over the p-well 41 an n-type semiconductor region (n-type diffusion layer) and a p-type semiconductor region (p-type diffusion layer) are formed as to be adjacent to each other in a planar manner. A PN junction between the n-type semiconductor region 55 and the p-type semiconductor region forms the diode element D1.

Moreover, the configuration of the diode element forming region 21 is almost the same as the one with the reversed conductivity types of the diode element forming region 24. Namely, in the diode element forming region 21, over the n-well 42 a p-type semiconductor region (p-type diffusion layer) 56 and an n-type semiconductor region (n-type diffusion layer) are formed as to be adjacent to each other in a planar manner, and a PN junction between the p-type semiconductor region 56 and the n-type semiconductor region forms the diode element D2.

Moreover, a guard ring (p-type diffusion layer) 57 is formed around the n-channel type MOS transistor forming region 26 and the diode element forming region 23 in the principal surface of the semiconductor substrate 40. Moreover, a guard ring (n-type diffusion layer) 57 is formed around the diode element forming region 21 and the p-channel type MOS transistor forming region 23 in the principal surface of the semiconductor substrate 30.

A plurality of interlayer dielectrics and a plurality of interconnect layers are formed over the semiconductor substrate 40. That is, a first layer wire M1, a second layer wire M2, a third layer wire M3, a fourth, layer wire M4, a fifth layer wire M5, a sixth layer wire M6, and a seventh layer wire M7 are formed sequentially in this order from the bottom, over the principal surface of the semiconductor substrate 40. Among these, the first layer wire M1 is formed of, for example, a patterned tungsten film and the like, and the second layer wire M2, the third layer wire M3, the fourth layer wire M4, the fifth layer wire M5, the sixth layer wire M6, and the seventh layer wire M7 are formed of an embedded copper wire formed by the damascene method (single damascene or dual damascene method), for example. As the other form, the wires M2-M7 may be aluminum wires comprised of a patterned aluminum alloy film and the like.

Between the semiconductor substrate 40 and the first layer wire M1 and between each of the wires M1-M7, an interlayer dielectric made of a silicon oxide film or a low-dielectric-constant insulating film (so-called Low-k film) is formed. Moreover, the wires M1-M7 are each electrically coupled to each other via a conductive plug PG formed in the interlayer dielectric, as needed. If the wires (M2-M7) are formed by the dual damascene method, the plug PG is formed integrally with the wires (M2-M7). Moreover, the first layer wire M1 is electrically coupled to an element (semiconductor element or passive element) formed in the principal surface of the semiconductor substrate 40 via the conductive plug PG formed in the interlayer dielectric, as needed.

The seventh layer wire M7 serves as the top layer, and the bonding pad 11 is formed using this top layer. The I/O power wire 15 for supplying a high-potential-side supply voltage VCCQ and the I/O ground wire 16 to be set to a ground level VSSQ are formed of the third layer wire M3, the fourth layer wire M4, and the fifth layer wire M5, and the plug PG for coupling these wires. In addition, a part of the sixth layer wire M6 is used as a buffer for bonding, and this portion is not used as wire.

The diode element forming region 21, the resistance element forming region 22, and the p-channel type MOS transistor forming region 23 are formed in the vicinity of the I/O power wire 15. This can shorten the wire length between the cathode of the diode element D1 as well as the source electrode of the p-channel type MOS transistor QP1, and the I/O power wire 15. Moreover, the arrangement of the diode element D1 and the p-channel type MOS transistor QP1 in the vicinity of the I/O power wire 15 allows the diode element D1 and the p-channel type MOS transistor QP1 to share the I/O power wire 15. The I/O power wire 15 can allow for a high current, because it is formed of the third layer wire M3, the fourth layer wire M4, and the fifth layer wire M5, and the plug PG for coupling these wires and thus the I/O power wire 15 can have a large cross section area as the wire. This gives robustness against EM and also ESD because a sufficient amount of surge current can be fed to the high-potential-side supply voltage VCCQ line via the diode D1.

Moreover, the diode element forming region 24, the resistance element forming region 25, and the n-channel type MOS transistor forming region 26 are formed in the vicinity of the I/O ground wire 16. This can shorten the wire length between the anode of the diode element D2 as well as the source electrode of the n-channel type MOS transistor QN2, and the I/O ground wire 16. Moreover, the arrangement of the diode element D2 and the n-channel type MOS transistor QN2 in the vicinity of the I/O ground wire 16 allows the diode element D2 and the n-channel type MOS transistor QN2 to share the I/O ground wire 16. The I/O ground wire 16 can allow for a high current because it is formed of the third layer wire M3, the fourth layer wire M4, and the fifth layer wire M5, and the plug PG for coupling these wires and thus the I/O ground wire 16 can have a large cross section area as the wire. This gives robustness against EM and also ESD because a sufficient amount of surge current can be fed to the ground VSSQ line via the diode D2.

As apparent from FIG. 12, the anode of the diode element D1, the cathode of the diode element D2, and the one ends of the resistance elements R1, R2, and the bonding pad 11 (seventh layer wire M7) need to be electrically coupled to one another. This coupling is made using the lead-out areas 31, 32 located at both ends of the I/O cell 17. That is, the anode of the diode element D1 and one end of the resistance element R1 are electrically coupled to the bonding pad 11 (seventh layer wire M7) via the lead-out area 31, while the cathode of the diode element D2 and one end of the resistance element R2 are electrically coupled to the bonding pad 11 (seventh layer wire M7) via the lead-out area 32. The lead-out areas 31, 32 are formed of the second layer wire M2, the third layer wire M3, the fourth layer wire M4, the fifth layer wire M5, the sixth layer wire M6, and the seventh layer wire M7, and the plug PG for coupling these wires.

According to the above-described embodiment, the following operation effects can be obtained.

(1) Since the diode element forming region 21, the resistance element forming region 22, and the p-channel type MOS transistor forming region 23 are formed in the vicinity of the I/O power wire 15, it is possible to shorten the wire length between the cathode of the diode element D1 as well as the source electrode of the p-channel type MOS transistor QP1, and the I/O power wire 15. Moreover, since the diode element forming region 24, the resistance element forming region 25, and the n-channel type MOS transistor forming region 26 are formed in the vicinity of the I/O ground wire 16, it is possible to shorten the wire length between the anode of the diode element D2 as well as the source electrode of the n-channel type MOS transistor QN2, and the I/O ground wire 16.

(2) The arrangement of the diode element D1 and the p-channel type MOS transistor QP1 in the vicinity of the I/O power wire 15 allows the diode element D1 and the p-channel type MOS transistor QP1 to share the I/O power wire 15. The I/O power wire 15 can allow for a high current because it is formed of the third layer wire M3, the fourth layer wire M4 and the fifth layer wire M5, and the plug PG for coupling these wires and thus the I/O power wire 15 can have a large cross section area as the wire. Moreover, the arrangement of the diode element D2 and n-channel type MOS transistor QN2 in the vicinity of the I/O ground wire 16 allows the diode element D2 and the n-channel type MOS transistor QN2 to share the I/O ground wire 16. The I/O ground wire 16 can allow for a high current because it is formed of the third layer wire M3, the fourth layer wire M4, and the fifth layer wire M5, and the plug PG for coupling these wires and thus the I/O ground wire 16 can have a large cross section area as the wire. Since this embodiment thus allows for a high current, it gives robustness against EM and also ESD because a sufficient amount of surge current can be fed to the power source line.

Figure 3:
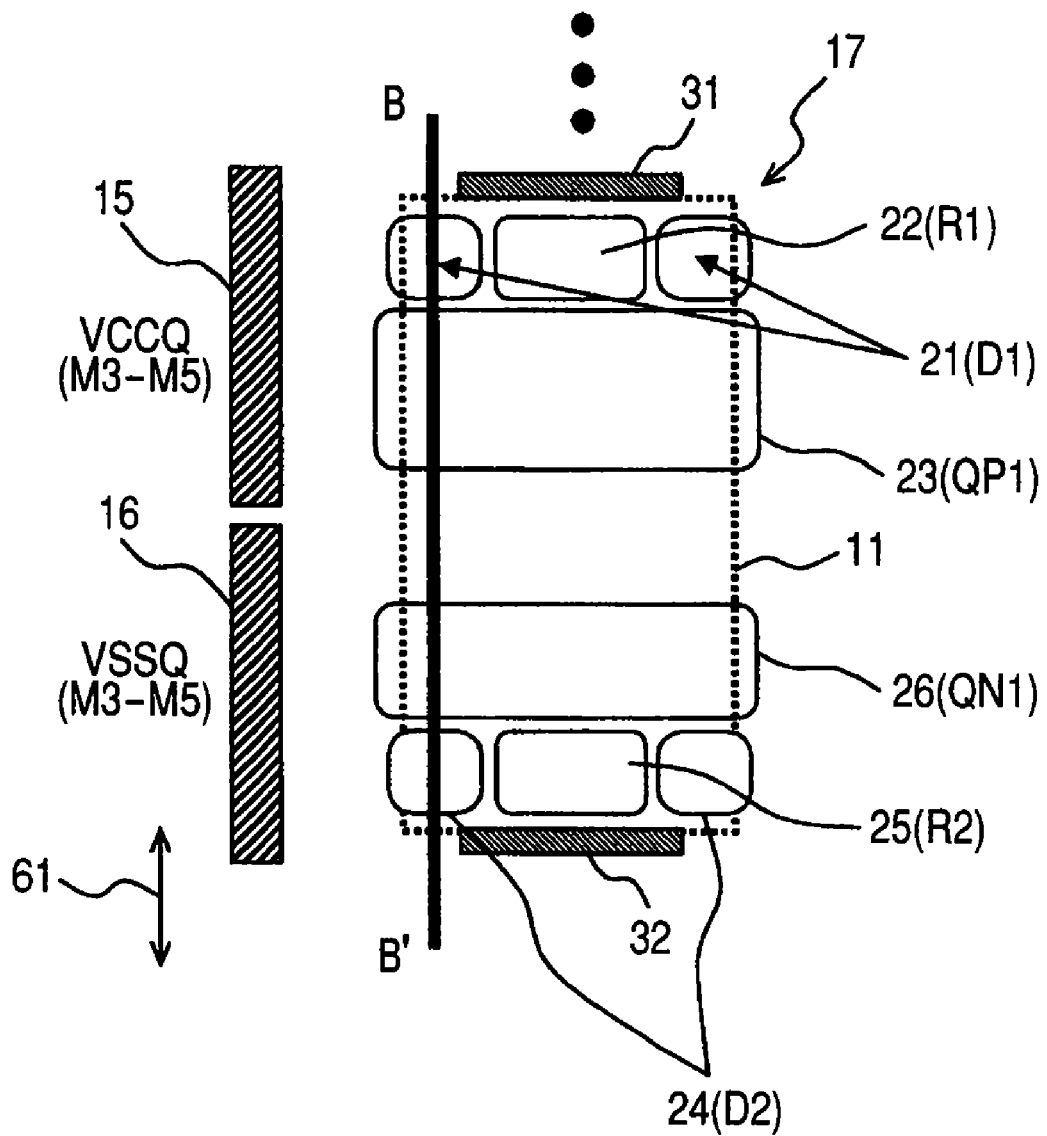
FIG. 3 is another plan view of the principal part in the semiconductor integrated circuit device concerning the present invention.

FIG. 3 shows another layout example of the principal part in FIG. 11. Moreover, FIG. 4 magnifies and shows the cross section cut along B-B' line in FIG. 3.

Figure 2:
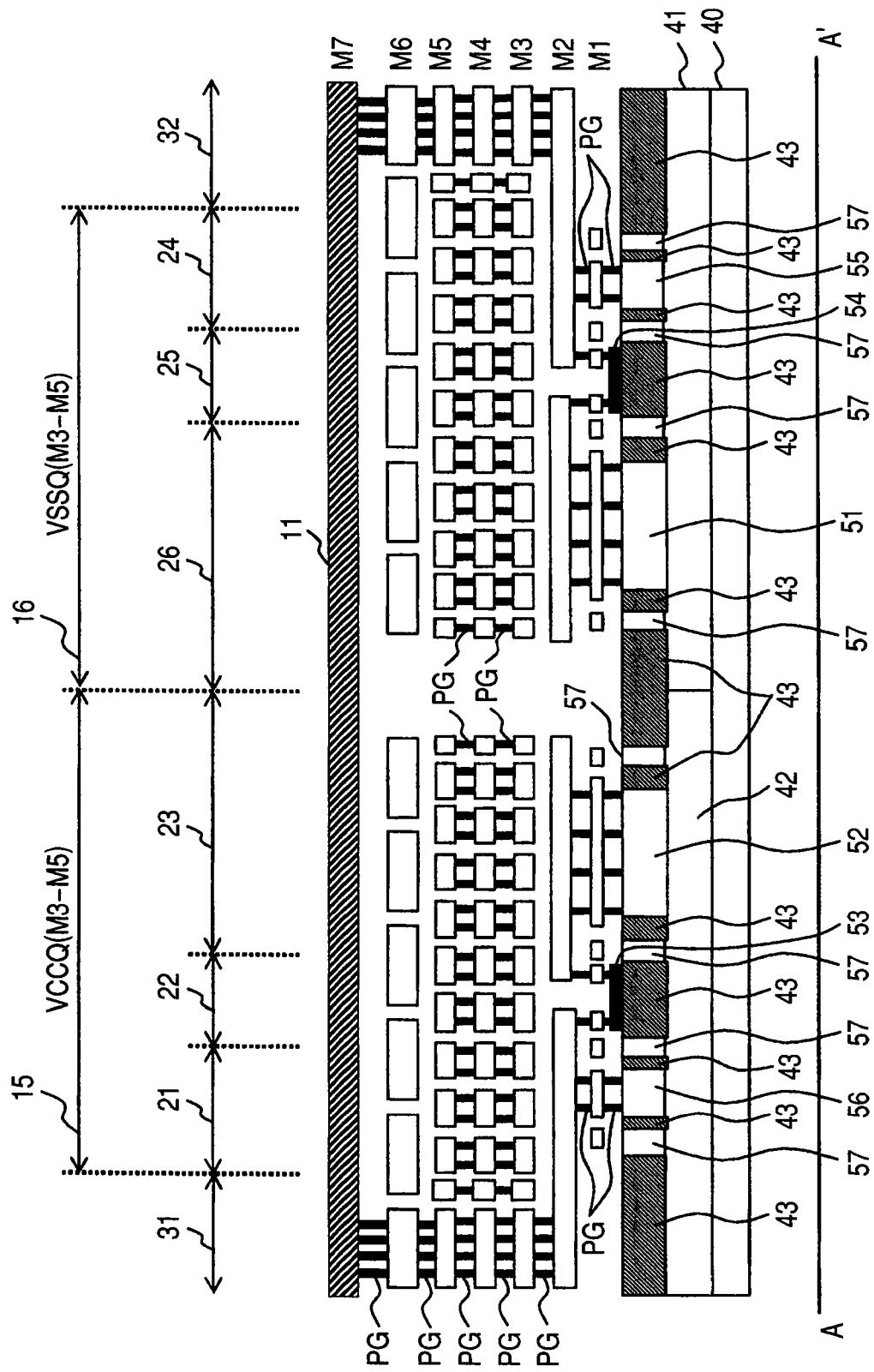
FIG. 2 is a cross sectional view along A-A' line in FIG. 1.
Figure 4:
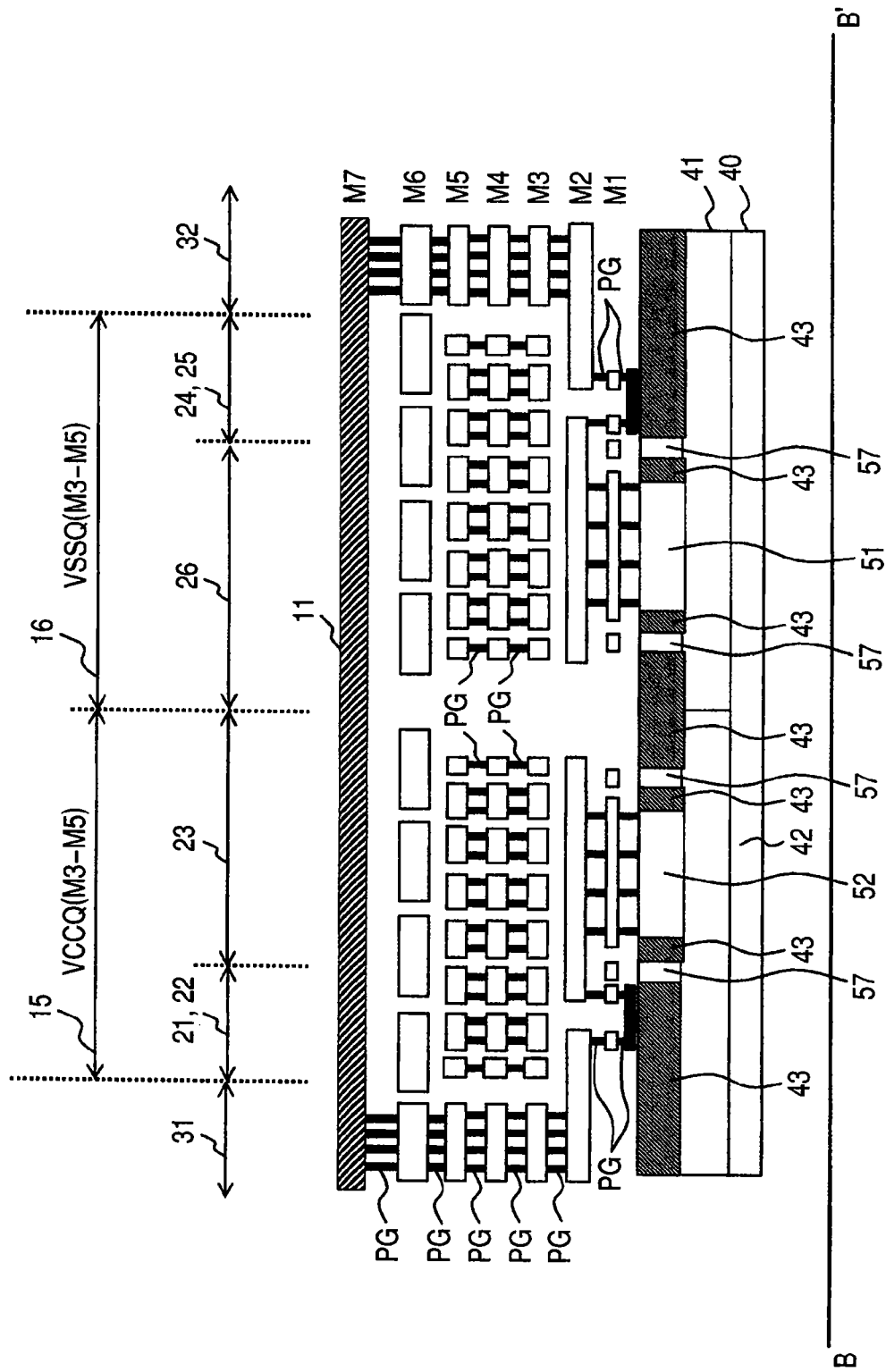
FIG. 4 is a cross sectional view along B-B' line in FIG. 3.

The configurations shown in FIG. 3 and FIG. 4 differ greatly from the ones shown in FIG. 1 and FIG. 2 in that the diode element D1 forming region 21 is provided while sandwiching the resistance element R1 forming region 22 therebetween, and that the diode element D2 forming region 24 is provided while sandwiching the resistance element R2 forming region 25 therebetween. Since the diode element D1 forming regions 21 is provided while sandwiching the resistance element R1 forming region 22 therebetween, and the diode element D2 forming region 24 is provided while sandwiching the resistance element R2 forming region 25 therebetween, it is possible to reduce the dimension in the longitudinal direction (the arrow 61 direction) of the I/O cell 17 as compared with the configurations shown in FIG. 1 and FIG. 2.

Figure 5:
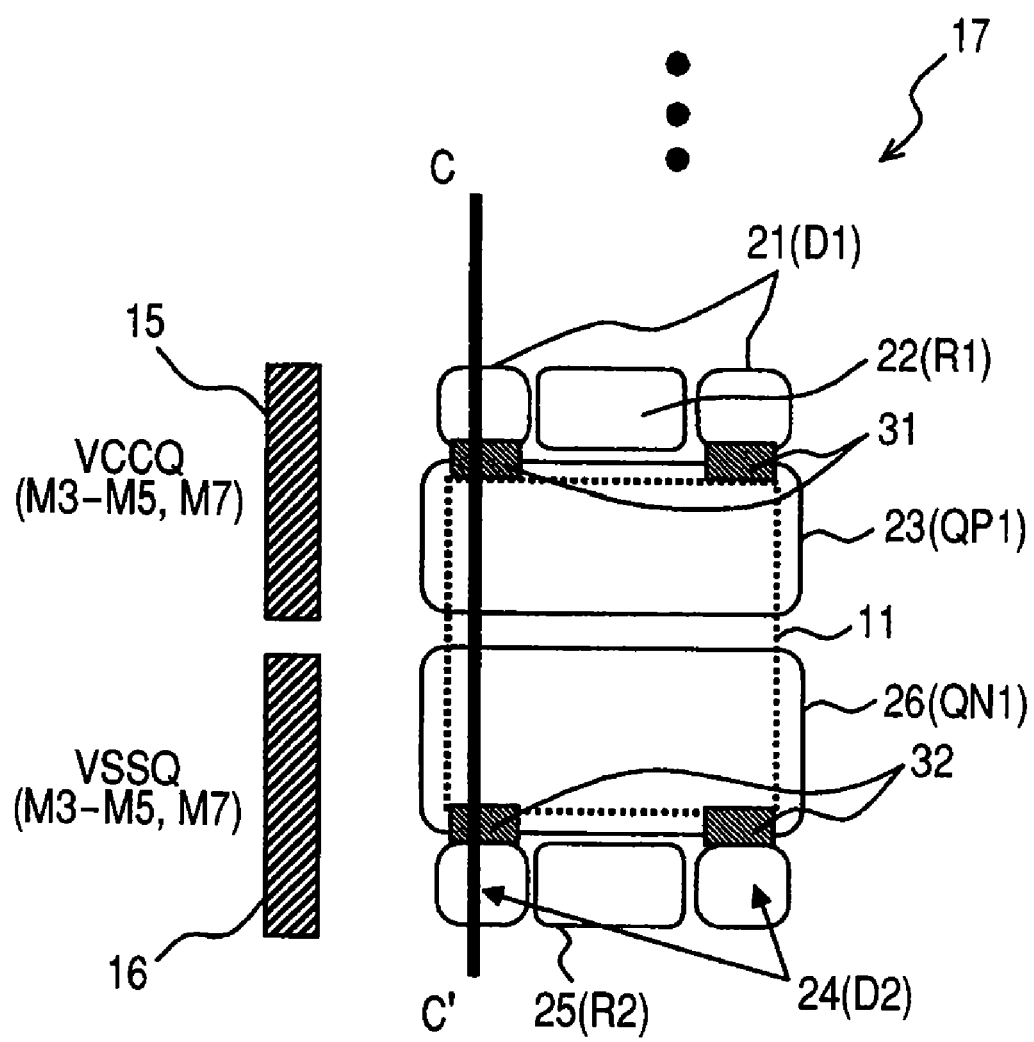
FIG. 5 is another plan view of the principal part in the semiconductor integrated circuit device concerning the present invention.

FIG. 5 shows another layout example of the principal part in FIG. 11. Moreover, FIG. 6 magnifies and shows the cross section cut along C-C' line in FIG. 5.

Figure 6:
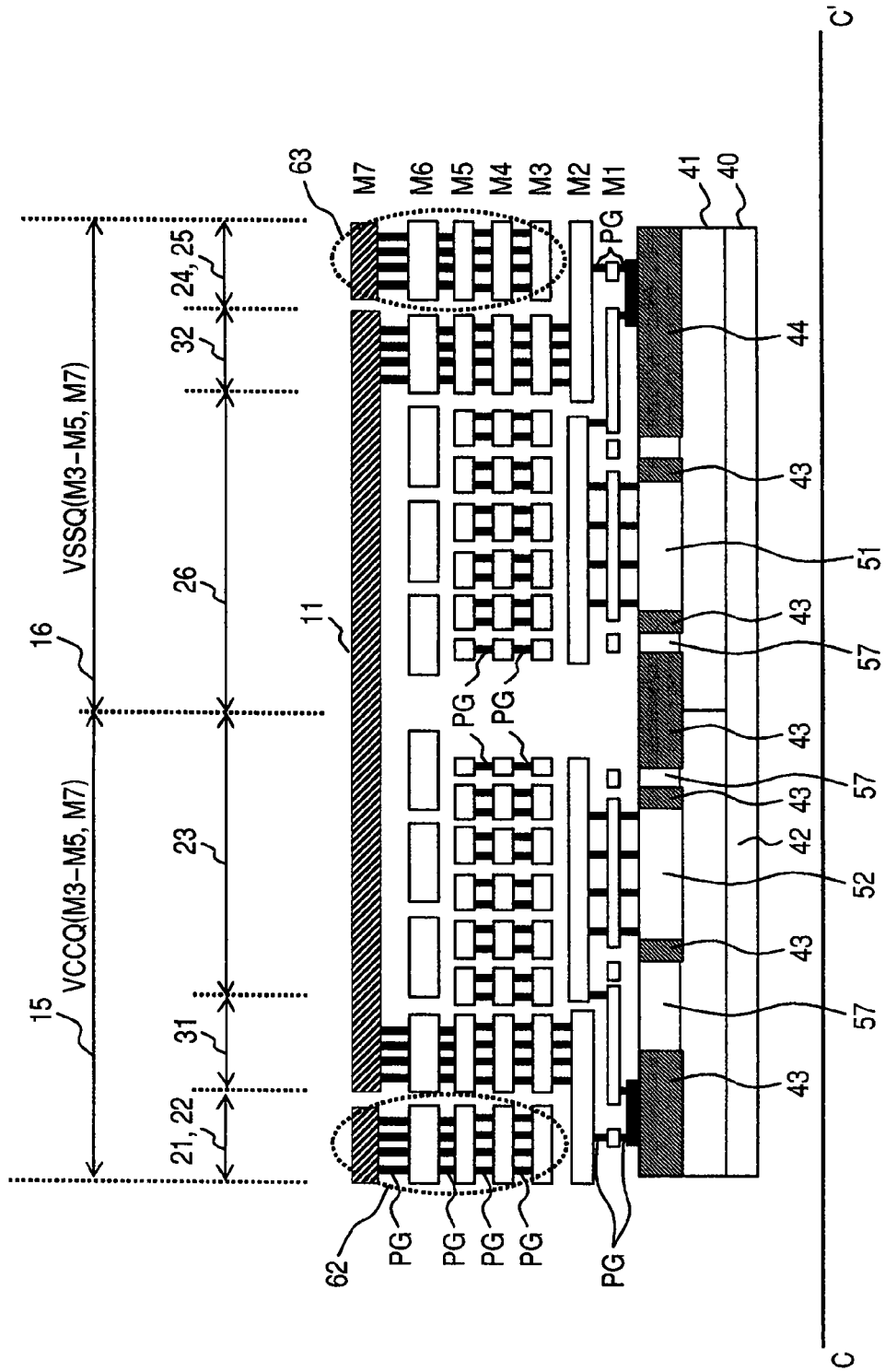
FIG. 6 is a cross sectional view along C-C' line in FIG. 5.

The configurations shown in FIG. 5 and FIG. 6 differ greatly from the ones shown in FIG. 3 and FIG. 4 in that the forming positions of the resistance element R1 forming region 22 and diode element D1 forming region 21 and of the lead-out area 31 are interchanged, and that the forming position of the resistance element R2 forming region 25 and diode element D2 forming region 24 and of the lead-out area 32 are interchanged. This reduces the dimensions of the bonding pad 11 formed of the seventh layer wire M7. Then, a wire group 62 including the third layer wire M3, the fourth layer wire M4, the fifth layer wire M5, the sixth layer wire M6, and the seventh layer wire M7 corresponding to the resistance element R1 forming region 22 and diode element D1 forming region 21 can be added to a part of the I/O power wire 15. Similarly, a wire group 63 including the third layer wire M3, the fourth layer wire M4, the fifth layer wire M5, the sixth layer wire M6, and the seventh layer wire M7 corresponding to the resistance element R2 forming region 25 and diode element D2 forming region 24 can be added to a part of the I/O ground wire 16. Thus, according to the configuration shown in FIG. 5 and FIG. 6, the cross-section area of the I/O power wire 15 can be further increased by securing the wire group 62, and the cross-section area of the I/O ground wire 16 can be further increased by securing the wire group 63.

Figure 7:
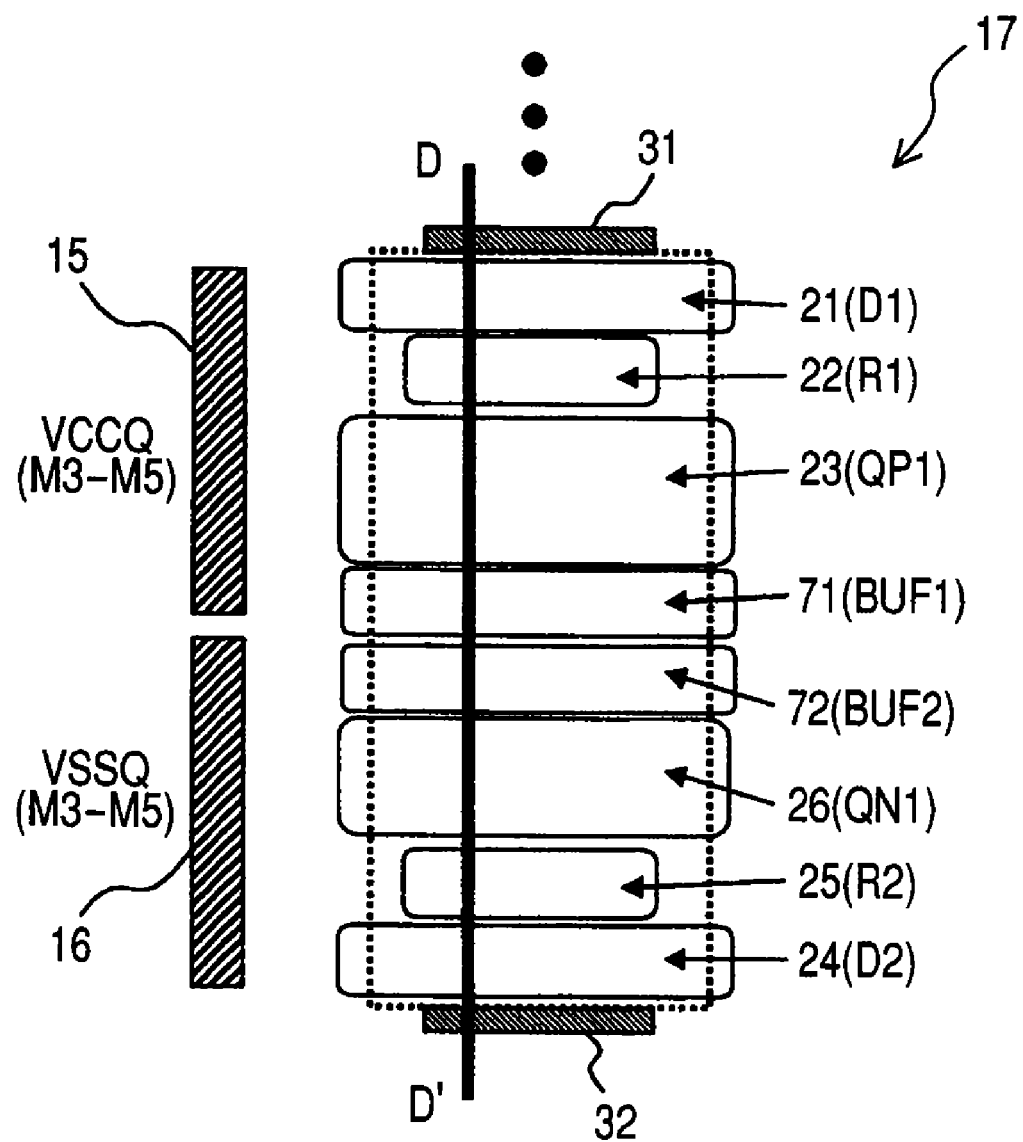
FIG. 7 is another plan view of the principal part in the semiconductor integrated circuit device concerning the present invention.

FIG. 7 shows another layout example of the principal part in FIG. 11. Moreover, FIG. 8 magnifies and shows the cross section cut along D-D' line in FIG. 7.

Figure 8:
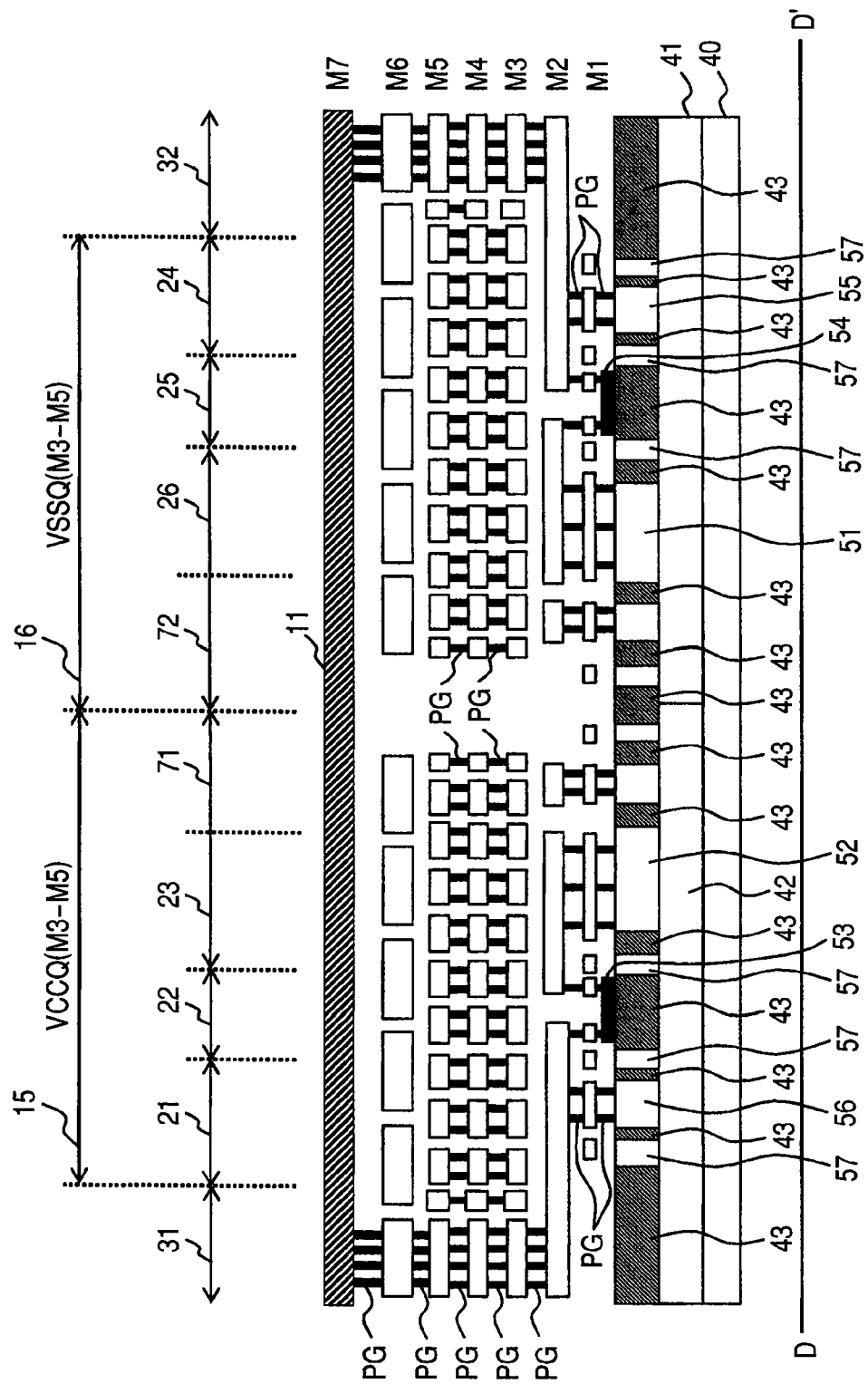
FIG. 8 is a cross sectional view along D-D' line in FIG. 7.
Figure 13:
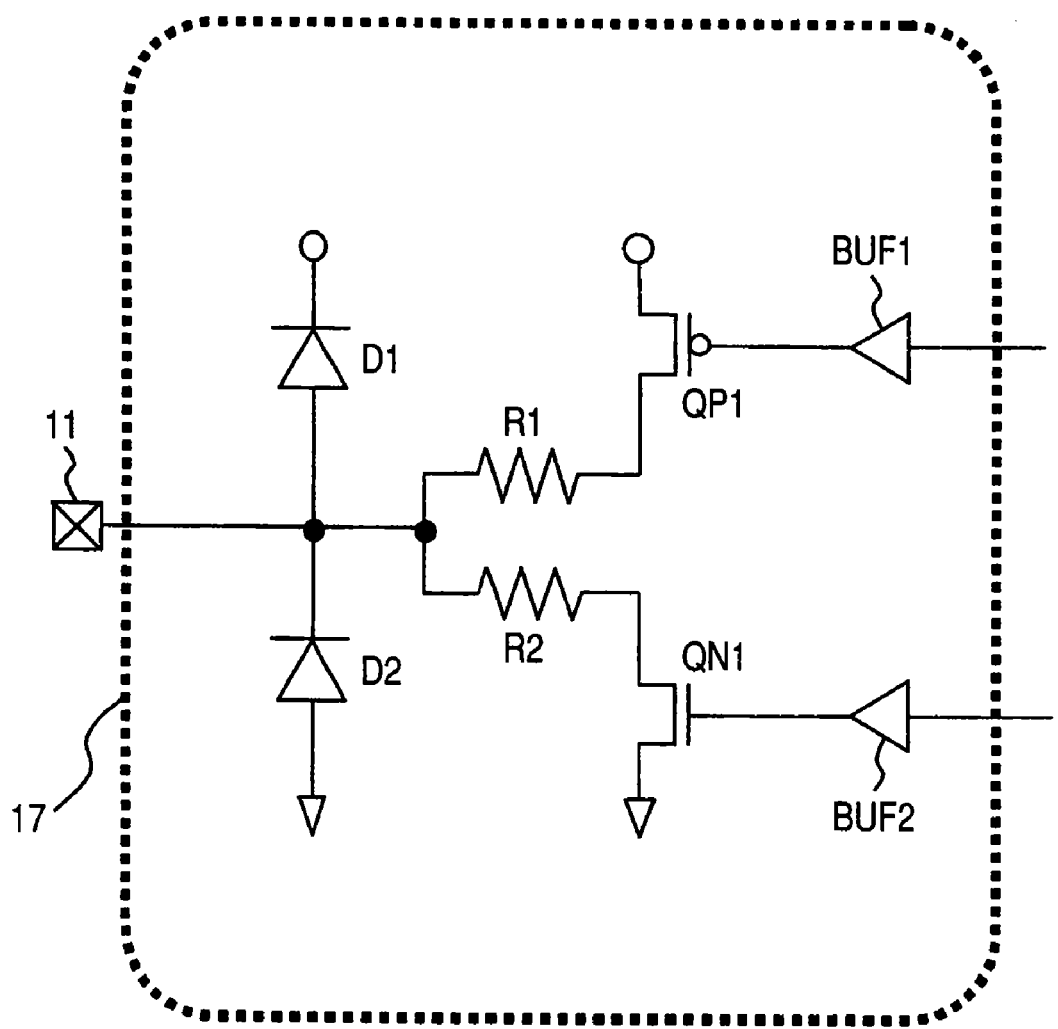
FIG. 13 is another circuit diagram of a configuration example of the I/O cell in the semiconductor integrated circuit device concerning the present invention.

The configurations shown in FIG. 7 and FIG. 8 differ greatly from the ones shown in FIG. 1 and FIG. 2 in that a p-channel type MOS transistor BUF1 forming region 71 for constituting a pre-buffer and an n-channel type MOS transistor BUF2 forming region 72 for constituting a pre-buffer are provided between the p-channel type MOS transistor QP1 forming region 23 and the n-channel type MOS transistor QN1 forming region 26, in the I/O cell 17. As shown in FIG. 13, the p-channel type MOS transistor BUF1 and n-channel type MOS transistor BUF2 constituting the pre-buffers are provided for driving the p-channel type MOS transistor QP1 and n-channel type MOS transistor QN1. Depending on the semiconductor substrate, the p-channel type MOS transistor QP1 and the n-channel type MOS transistor QN1 need to be separated from each other to some extent as a countermeasure against latchup. Then, as shown in FIG. 7 and FIG. 8, if the p-channel type MOS transistor BUF1 and the n-channel type MOS transistor BUF2 constituting the pre-buffers are placed between the p-channel type MOS transistor QP1 and the n-channel type MOS transistor QN1, a space between the p-channel type MOS transistor QP1 and the n-channel type MOS transistor QN1 can be used effectively. In addition, although the illustration of the configuration of the pre-buffer is omitted, a well-known circuit configuration comprised of a combination of a p-channel type MOS transistor and an n-channel type MOS transistor can be applied. In this case, a p-channel type MOS transistor of the pre-buffer for constituting BUF1 is placed on the side of I/O power wire 15, and an n-channel type MOS transistor of the pre-buffer for constituting BUF2 is placed on the side of I/O ground wire 16. This allows the I/O power wire 15 and the I/O ground wire 16 to be shared with other elements.

Also with regard to the power cell for taking in a power supply from the outside, the PAA structure can be employed. Hereinafter, a configuration example in this case will be described.

Figure 9:
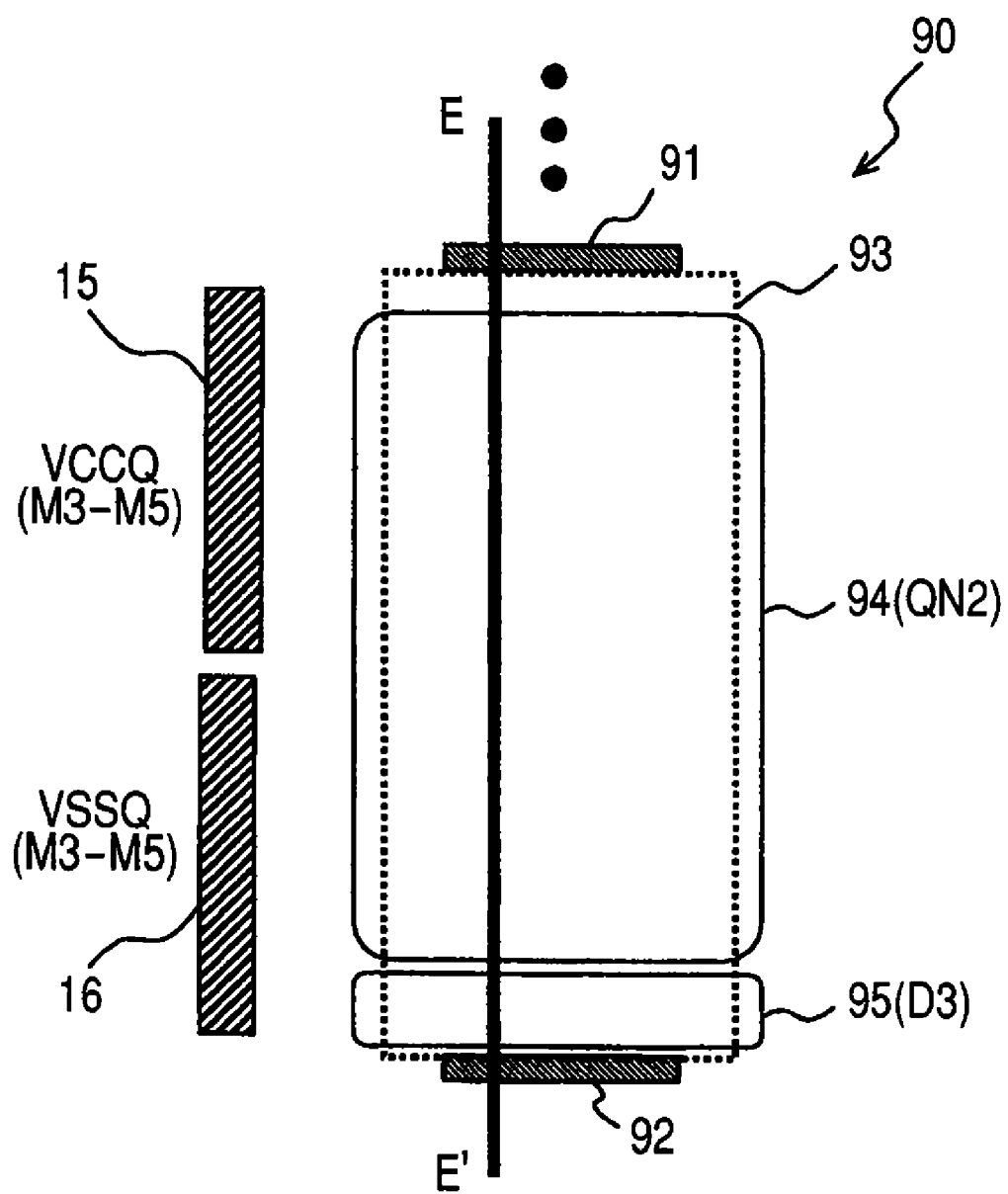
FIG. 9 is another plan view of the principal part in the semiconductor integrated circuit device concerning the present invention.

FIG. 9 shows another layout example of the principal part in FIG. 11. Moreover, FIG. 10 magnifies and shows the cross section cut along E-E' line in FIG. 9.

In order to take in a supply voltage from the outside, a power cell 90 is placed in the outer peripheral portion of the principal surface of the semiconductor integrated circuit device 10, as with a plurality of I/O cells 17 shown in FIG. 11.

Figure 14:
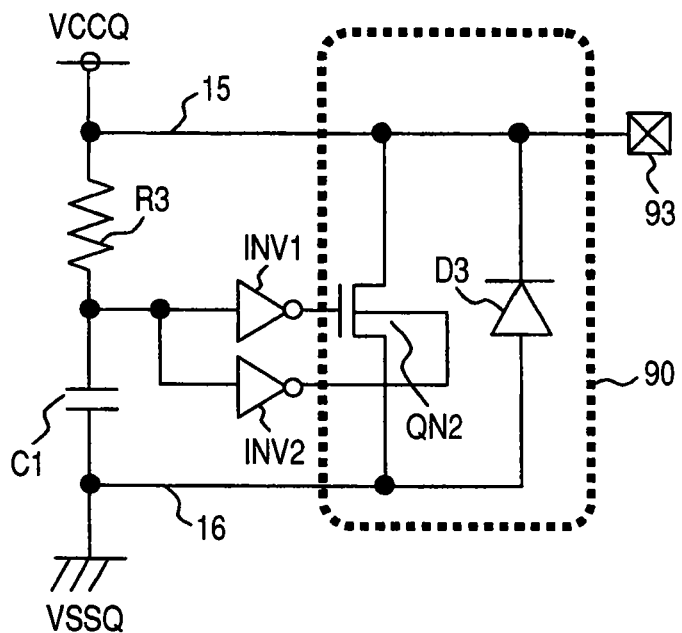
FIG. 14 is a circuit diagram of a configuration example of a power cell in the semiconductor integrated circuit device concerning the present invention.

The power cell 90 comprises an n-channel type MOS transistor QN2 used for clamp and a diode element D3, as shown in FIG. 14. The n-channel type MOS transistor QN2 is coupled to the I/O power wire 15 and the I/O ground wire 16. The diode element D3 is coupled in parallel with the n-channel type MOS transistor QN2. A resistance element R3 and a capacitive element C1 are coupled in series, and a potential of this serial connection node is transmitted to inverters INV1 and INV2. The outputs of the inverters INV1 and INV2 are transmitted to the gate electrode and the back gate of the n-channel type MOS transistor QN2, respectively. If an ESD surge enters a power-supply bonding pad 93 and the I/O power wire 15, then until a predetermined time elapsed the outputs of the inverters INV1 and INV2 will be at a high level to turn on the n-channel type MOS transistor QN2, so that the I/O power wire 15 is short-circuited to the I/O ground wire 16. If the capacitive element C1 is charged via the resistance element R3 and the terminal voltage of the capacitive element C1 reaches a specified level, then the outputs of the inverters INV1 and INV2 are inverted from at a high level to at a low level, thereby turning off the n-channel type MOS transistor QN2. Such operation prevents an undesired surge from being applied to each circuit element via the I/O power wire 15.

Figure 10:
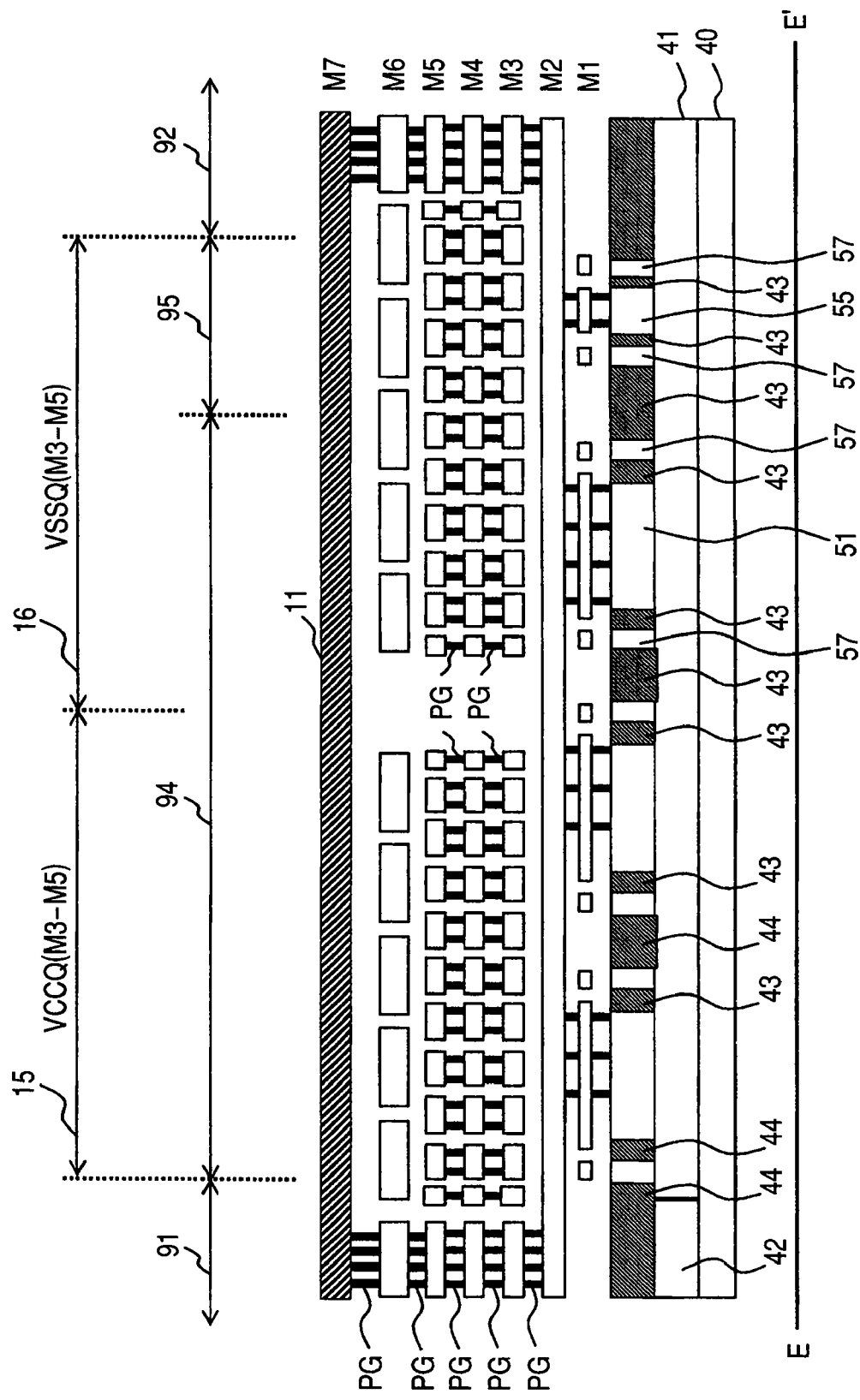
FIG. 10 is a cross sectional view along E-E' line in FIG. 9.

As shown in FIG. 9 and FIG. 10, an n-channel type MOS transistor QN2 forming region 94 and a diode element D1 forming region 95 are provided in the power cell 90. The n-channel type MOS transistor QN2 forming region 94 and the diode element D1 forming region 95 are placed in the vicinity of the I/O power wire 15 or the I/O ground wire 16, and are formed into a PAA structure, as with the I/O cell 17.

As described above, although the invention made by the present inventor has been described specifically, it is apparent that the present invention is not limited thereto and various modifications can be made without departing from the scope of the invention.

The present invention is suitably applied to semiconductor integrated circuit devices having a bonding pad.

What is claimed is:

1. A semiconductor integrated circuit device, comprising:
a semiconductor substrate having a main surface which has an edge;
a plurality of I/O cells disposed in a row extending along the edge of the main surface, each of the plurality of I/O cells including a first MOS transistor and a second MOS transistor, in which a shortest distance between the first MOS transistor and the edge of the main surface is smaller than that between the second MOS transistor and the edge of the main surface;

a bonding pad disposed over the main surface, the bonding pad being overlapped with the first MOS transistor and the second MOS transistor of each of the plurality of I/O cells in plan view;

a first wire disposed under the bonding pad, the bonding pad being overlapped with the first wire in plan view;

a first conductive plug disposed between the bonding pad and the first wire, the first conductive plug connecting the bonding pad and the first wire;

a second wire disposed under the bonding pad, the bonding pad being overlapped with the second wire in plan view;

a second conductive plug disposed between the bonding pad and the second wire, the second conductive plug connecting the bonding pad and the second wire; and a plurality of interconnect layers between the plurality of I/O cells and the bonding pad, wherein a first power wire and a second power wire are formed of the interconnect layers while excluding an interconnect layer directly under the bonding pad, wherein the bonding pad is electrically coupled to the first MOS transistor and to the second MOS transistor via the first and second wires, respectively, wherein the first conductive plug and the first wire are located between the first MOS transistor and the edge of the main surface in plan view, and wherein the second conductive plug and the second wire are further than the second MOS transistor from the edge of the main surface in plan view.

2. The semiconductor integrated circuit device of claim 1, wherein the first power wire is a power wire for the I/O cells, and wherein the second power wire is a ground wire for the I/O cells.

3. A semiconductor integrated circuit device, comprising:

a semiconductor substrate having a main surface which has an edge;

a plurality of I/O cells disposed in a row extending along the edge of the main surface, each of the plurality of I/O cells including a first MOS transistor and a second MOS transistor, in which a shortest distance between the first MOS transistor and the edge of the main surface is smaller than that between the second MOS transistor and the edge of the main surface;

a plurality of bonding pads disposed over the main surface, the bonding pads being overlapped with the first MOS transistor and the second MOS transistor of each of the plurality of I/O cells in plan view;

an I/O power wire and an I/O ground wire disposed under the bonding pads, the bonding pads being overlapped with the I/O power wire and the I/O ground wire in plan view;

a first conductive plug disposed between the bonding pads and the I/O power wire, the first conductive plug connecting the bonding pads and the I/O power wire; and a second conductive plug disposed between the bonding pads and the I/O ground wire, the second conductive plug connecting the bonding pads and the I/O ground wire, wherein the bonding pads are electrically coupled to the first MOS transistor and to the second MOS transistor via the I/O power wire and the I/O ground wire, respectively, wherein the first conductive plug and the I/O power wire are located between the first MOS transistor and the edge of the main surface in plan view, and wherein the second conductive plug and the I/O ground wire are arranged to be further from the edge of the main surface than the second MOS transistor in plan view.

4. The semiconductor integrated circuit device according to claim 3, further comprising:

a plurality of interconnect layers disposed between the plurality of I/O cells and the bonding pads, wherein the I/O power wire and the I/O ground wire are formed of the interconnect layers while excluding an interconnect layer directly under the bonding pads.

* * * * *